(12) United States Patent
Wang et al.

(10) Patent No.: US 7,598,179 B2
(45) Date of Patent: Oct. 6, 2009

(54) TECHNIQUES FOR REMOVAL OF PHOTOLITHOGRAPHIC FILMS

(75) Inventors: Runshun Wang, Shanghai (CN); Chao Wang, Shanghai (CN); Lien Huang Cheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 376 days.

(21) Appl. No.: 11/243,883

(22) Filed: Oct. 4, 2005
(Under 37 CFR 1.47)

(65) Prior Publication Data
US 2007/0072390 A1 Mar. 29, 2007

(30) Foreign Application Priority Data
Sep. 29, 2005 (CN) .................. 2005 1 0030309

(51) Int. Cl.
*H01L 21/301* (2006.01)
*H01L 21/461* (2006.01)
(52) U.S. Cl. .................. 438/715; 257/E21.492
(58) Field of Classification Search .................. 438/715; 257/E21.487, E21.492, E21.496
See application file for complete search history.

(56) References Cited

U.S. PATENT DOCUMENTS 6,268,457 B1* 7/2001 Kennedy et al. .............. 528/39
6,486,061 B1* 11/2002 Xia et al. .................... 438/680
6,686,570 B2* 2/2004 Furukawa et al. ........ 219/465.1
6,905,800 B1* 6/2005 Yuen et al. .................... 430/5
2005/0266691 A1* 12/2005 Gu et al. ..................... 438/706

OTHER PUBLICATIONS

Liou et al., "Effect of Curing Temperature on the Mechanical Properties of Hydrogen Silsesquioxane Thin Films", Jun. 1998, Thin Solid Films, vol. 335, pp. 186-191.*

* cited by examiner

*Primary Examiner*—W. David Coleman
(74) *Attorney, Agent, or Firm*—Townsend and Townsend and Crew LLP

(57) ABSTRACT

Techniques for removal of photolithographic films used in the manufacture of semiconductor devices are provided. A substrate support member of a first processing chamber includes at least three retractable pins capable of elevating a wafer from a surface of the substrate support member. In addition, the first processing chamber is configured to automatically maintain the substrate support member at a first temperature. The wafer is elevated from the surface of the substrate support member using the at least three retractable pins. Thermal heating of the substrate from the substrate support member is reduced. A photoresist layer of the substrate is etched away while the substrate is in an elevated position. An anti-reflective layer of the substrate can be etched to remove substantially all of the anti-reflective layer. In a specific embodiment, the anti-reflective layer includes a DUO™ Bottom Anti-Reflective Coating by Honeywell International Inc.

16 Claims, 4 Drawing Sheets

TECHNIQUES FOR REMOVAL OF PHOTOLITHOGRAPHIC FILMS

BACKGROUND OF THE INVENTION

The present invention is directed to integrated circuits and their processing for the manufacture of semiconductor devices. More particularly, the invention provides techniques for removing photolithographic films without substantial modifications to conventional equipment and processes. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is removal of photolithographic films (such as anti-reflective films) using conventional techniques. In conventional techniques, wet etching typically does not completely remove anti-reflective films, particularly DUO™ Bottom Anti-Reflective Coatings by Honeywell International Inc ("DUO"). FIGS. 1A-1C are a simplified illustrations of a conventional process for removing photolithographic films from a wafer 100. Wafer 100 includes a photoresist film 102, anti-reflective film 104, and a fluorine doped silicate glass (FSG) layer 106. In this example, photoresist film 102 and anti-reflective film 104 are used in a photolithographic process to form a trench 110 in FSG layer 106. The resulting trench 110 can be used as a via with a bottom copper trace 108. After the formation of trench 110 (or other features), photoresist layer 102 is removed using a dry ash process as shown in FIG. 1B. The dry ash process includes a wafer temperature of greater than 250 degrees Celsius in an oxygen atmosphere. Next, as illustrated in FIG. 1C, a wet etch process is performed to remove anti-reflective layer 104. Unfortunately, anti-reflective layer 104 is only partially removed. These and other limitations may be found throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides techniques for removing photolithographic films. Merely by way of example, the invention has been applied to removal of photolithographic films used in the manufacture of semiconductor devices without substantial modifications to conventional equipment and processes. But it would be recognized that the invention has a much broader range of applicability.

We have discovered that a high temperature baking effect during a dry ashing process can cause densification of a anti-reflective layer, specifically a DUO layer. Densification of the DUO layer results in substantially increased difficulty in removal of the DUO layer by a wet etch process. The baking effect can be avoided if wafer temperature is kept below the bake-in temperature of the DUO layer. However, this can be difficult in a processing chamber system where the substrate support member is configured to maintain a predetermined temperature above the bake-in temperature. Without modification to the processing chamber system and processes, wafer temperature can be reduced. During processing, the wafer can be elevated away from the substrate support member. Thermal heating from the substrate support member to the wafer is greatly reduced and a wafer temperature is reduced by at least 50 degrees Celsius. Thus, densification can be avoided or at least mitigated. In a specific embodiment, the wafer can be elevated or placed in a pin-up position by three retractable pins housed within the substrate support member.

In a specific embodiment, the invention provides a method for manufacturing an integrated circuit device. A wafer is positioned on a substrate support member (such as an echuck) of a first processing chamber. The substrate support member includes at least three retractable pins (e.g., 3, 4, 5, or more pins) capable of elevating the wafer from a surface of the substrate support member. In addition, the first processing chamber is configured to automatically maintain the substrate support member at a first temperature, which exceeds a bake-in temperature of an anti-reflective layer. Accordingly, the substrate support member is maintained at the first temperature. The wafer is elevated from the surface of the substrate support member using the at least three retractable pins. Thermal heating of the substrate from the substrate support member is reduced. A photoresist layer of the substrate is etched away while the substrate is in an elevated position. Next, an anti-reflective layer of the substrate can be etched to remove at least about 98% of the anti-reflective layer, or more preferably substantially all of the anti-reflective layer. The temperature of the wafer during the elevating, etching the photoresist layer, and etching the anti-reflective layer remains less than a bake-in temperature of the anti-reflective layer to avoid densification of the anti-reflective layer. In a specific embodiment, the anti-reflective layer includes DUO™ Bottom Anti-Reflective Coatings by Honeywell International Inc.

Many benefits are achieved by way of the present invention over conventional techniques. For example, the present technique provides an easy to use process that relies upon conventional technology. Additionally, the technique provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

DETAILED DESCRIPTION OF THE INVENTION

According to the present invention, techniques directed to integrated circuits and their processing for the manufacture of semiconductor devices are provided. More particularly, the invention provides techniques for removing photolithographic films. Merely by way of example, the invention has been applied to removal of photolithographic films used in the manufacture of semiconductor devices without substantial modifications to conventional equipment and processes. But it would be recognized that the invention has a much broader range of applicability.

Figure 1A:
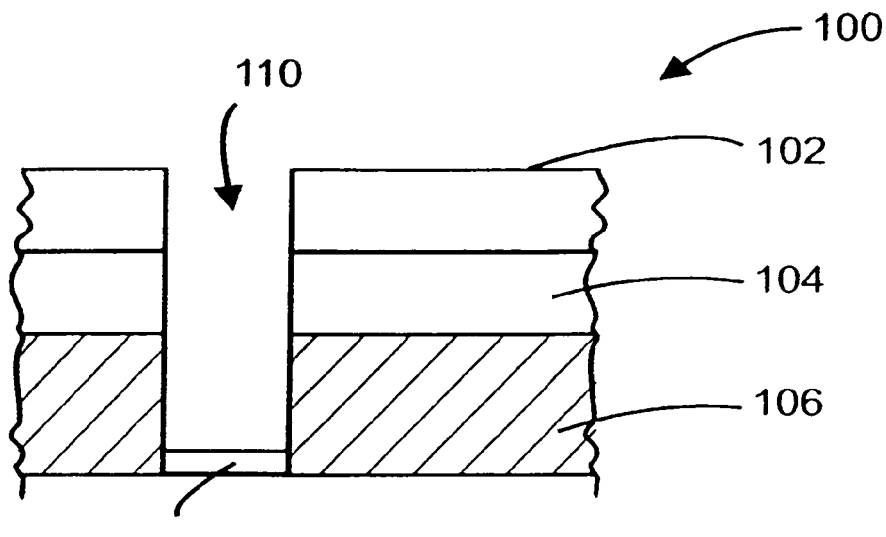
FIGS. 1A-1C are simplified diagrams illustrating a substrate during a conventional method for removing photolithographic films used in semiconductor processing.
Figure 1B:
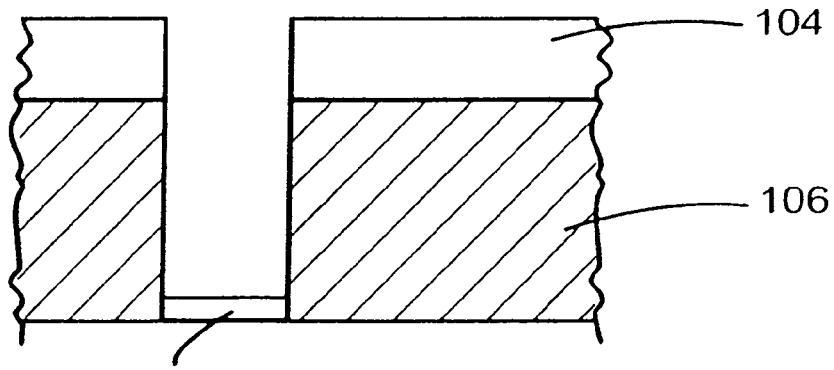
Figure 1C:
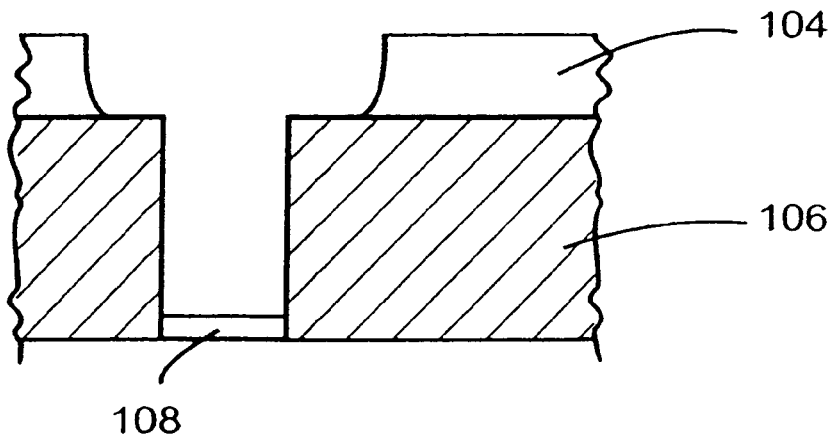
Figure 2:
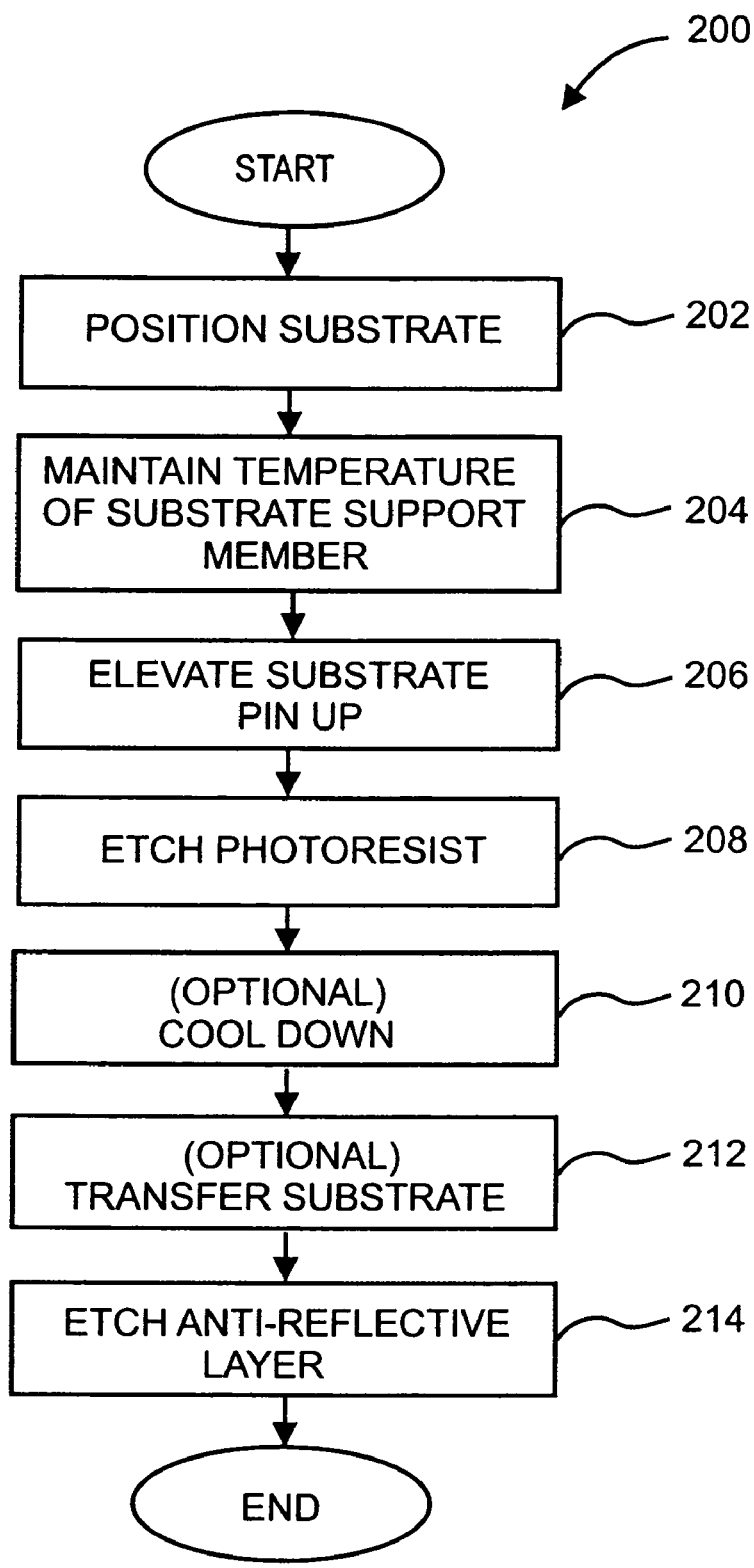
FIG. 2 illustrates a method for removing photolithographic films used for semiconductor processing according to an embodiment of the present invention.

FIG. 2 is a simplified method for removing photolithographic films according to an embodiment of the present invention. The method 200 includes the following processes:
1. Process 202 for positioning the wafer on a substrate support member in a first processing chamber;
2. Process 204 for maintaining the substrate support member at about predetermined temperature;
3. Process 206 for elevating wafer away from a surface of the substrate support member;
4. Process 208 for etching a photoresist layer;
5. (Optional) Process 210 for allowing the wafer to cool down in a second processing chamber;
6. (Optional) Process 212 for transferring the wafer to a third processing chamber configured to remove the anti-reflective layer; and
7. Process 214 for etching the anti-reflective layer to remove substantially all the anti-reflective layer or, alternatively, at least 98%.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 3A:
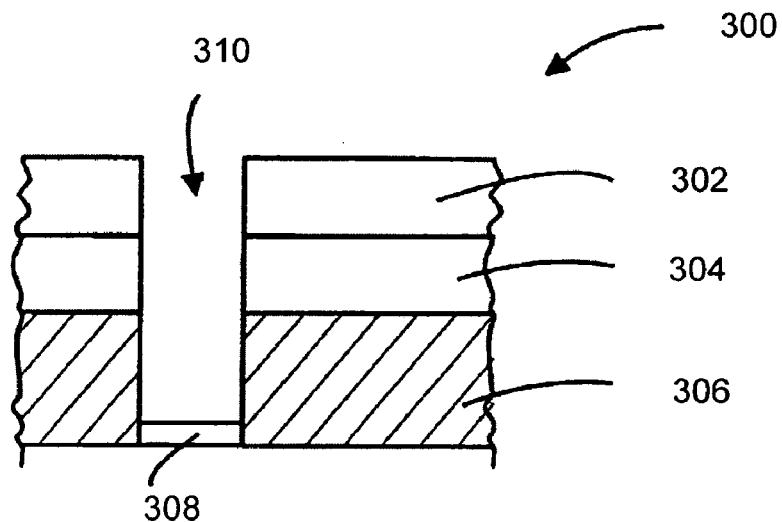
FIGS. 3A-3C are simplified diagrams illustrating a wafer during removal of photolithographic films used in semiconductor processing according to an embodiment of the present invention.
Figure 3B:
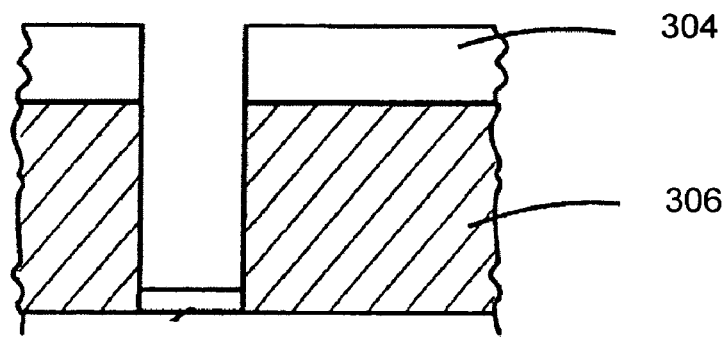
Figure 3C:
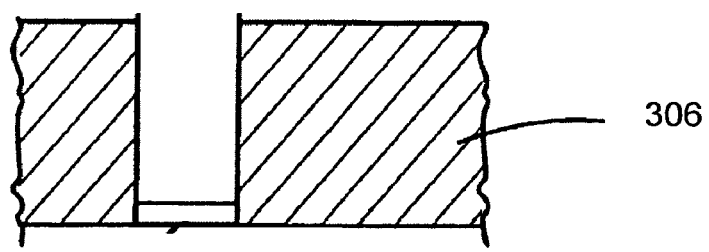

FIGS. 3A-3C are simplified diagrams illustrating a wafer during removal of photolithographic films used in semiconductor processing according to an embodiment of the present invention. Wafer 300 includes a photoresist film 302, anti-reflective film 304, and a fluorine doped silicate glass (FSG) layer 306. In this example, photoresist film 302 and anti-reflective film 304 are used in a photolithographic process to form a trench 310 in FSG layer 106. The resulting trench 310 can be used as a via with a bottom copper trace 108. After the formation of trench 310 (or other features), photoresist layer 302 is removed using a dry ash process as shown in FIG. 3B. The dry ash process includes a substrate support member temperature of at least about 250 degrees Celsius and an oxygen atmosphere. During the dry ash process the wafer is elevated from the substrate support member by at least three retractable pins housed in the substrated support member. While in the pin-up position, the wafer experiences significantly less heat transfer from the substrate support member. In fact, in an embodiment of the present invention, the wafer remains at least 50 degrees Celsius cooler than substrate support member during the needed time for the dry ash process. According to a specific embodiment of the present invention, the time needed for a dry ash process, and thus the exposure time to the hot substrate support member, ranges from about 60 seconds to about 100 seconds. Next, as illustrated in FIG. 3C, anti-reflective layer 304 is completely removed by a wet etch process. In an alternative embodiment, at least 98% of the anti-reflective layer is removed, which is a substantial improvement over the conventional process.

Experimental Results

To prove the principle and operation of the present invention, the inventors performed experiments. These experiments were merely examples and should not unduly limit the scope of the invention defined by the claims herein. One of ordinary skill in the art would recognize many other variations, modifications, and alternatives.

Figure 4A:
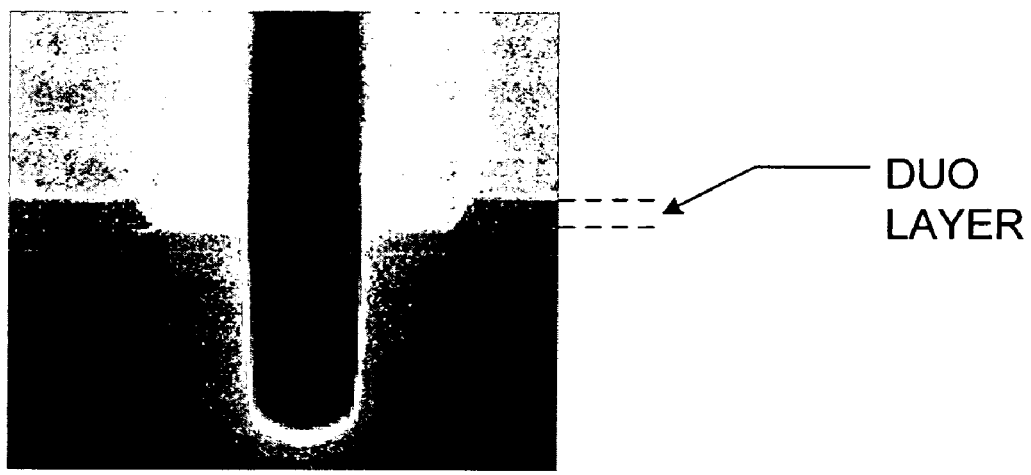
FIGS. 4A and 4B show cross-sectional views of a wafer using scanning electron microscopy after DUO removal with a conventional method and a method according to an embodiment of the present invention, respectively.

Photolithographic films were removed from a wafer with a conventional method. In particular, a dry ash process was used to remove a photoresist layer using an Aspen II Strip system by Mattson Technology, Inc. Throughout the dry ash process, the wafer was directly positioned on a surface of the substrate support member. The temperature of the substrate support member was automatically maintained at 250 degrees Celsius as measured by a thermocouple. After removal of the photoresist layer, the wafer was allowed to cool down in a cooldown chamber. The wafer was then transferred to another processing chamber system for removal of a DUO layer. The wafer was immersed in hydrofluoric acid (HF) to etch the DUO layer. After completion of the removal of the photoresist and DUO layers, the wafer was inspected using scanning electron microscopy. As shown in FIG. 4A, a significant amount of the DUO layer remained.

Figure 4B:
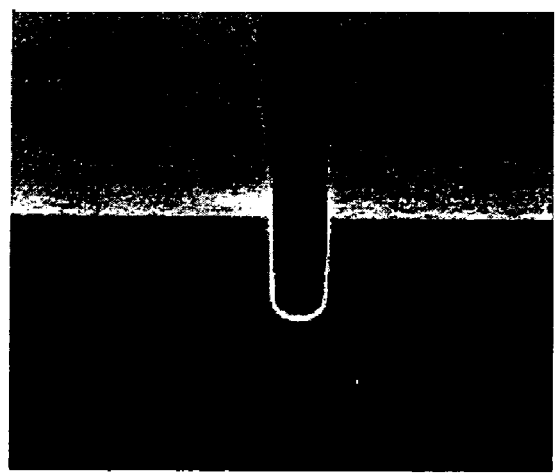

FIG. 4B shows a wafer after removal of photolithographical films using a method according to embodiment of the present invention. An Aspen II Strip system by Mattson Technology, Inc. was used for the dry ash process to remove a photoresist layer. Throughout the dry ash process, the wafer was maintained in a pin-up position (or elevated by three retractable pins) and thus away from the surface of the substrate support member. The temperature of the substrate support member was maintained at 250 degrees Celsius. However, the temperate of the wafer was substantially lower than the substrate support member. After removal of the photoresist layer, the wafer was allowed to cool down in a cooldown chamber. The wafer was then transferred to another processing chamber system for removal of the DUO layer. The wafer was immersed in hydrofluoric acid (HF) to etch the DUO layer. After completion of the removal of the photoresist and DUO layers, the wafer was inspected using scanning electron microscopy. As shown in FIG. 4B, the DUO layer was completely etched away.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing an integrated circuit device, the method comprising:

positioning a substrate on a substrate support member of a first processing chamber, the first processing chamber is configured to automatically maintain the substrate support member at a first temperature, and the substrate support member includes at least three retractable pins capable of elevating the substrate from a surface of the substrate support member;

maintaining the substrate support member at the first temperature; elevating the substrate away from the surface of the substrate support member using the at least three retractable pins, thereby reducing thermal heating of the substrate from the substrate support member;

etching a photoresist layer overlying the substrate in an atmosphere that includes oxygen while the substrate is in an elevated position such that the substrate is away from the surface of the substrate support member during the etching of the photoresist layer; and etching an anti-reflective layer overlying the substrate to remove at least about 98% of the anti-reflective layer;

wherein a temperature of the substrate during the elevating, etching the photoresist layer, and etching the anti-reflective layer remains less than a bake-in temperature of the anti-reflective layer to avoid densification of the anti-reflective layer, and the first temperature exceeds the bake-in temperature for the anti-reflective layer.

2. The method of claim 1 wherein the first temperature is at least about 250 degrees Celsius.

3. The method of claim 1 wherein the bake-in temperature for the anti-reflective layer is greater than about 210 degrees Celsius.

4. The method of claim 1 wherein the anti-reflective layer comprises DUO.

5. The method of claim 1 further comprising transferring the substrate to a second processing chamber to allow the substrate to cool between the etching of the photoresist and the etching of the anti-reflective layer.

6. The method of claim 1 wherein the substrate comprises silicon.

7. The method of claim 1 wherein substantially all of the anti-reflective layer is removed by the etching of the anti-reflective layer.

8. The method of claim 4 wherein a thickness of the anti-reflective layer ranges from 0.2 microns to about 0.25 microns prior to the etching of the anti-reflective layer.

9. The method of claim 5 wherein the etching of the anti-reflective layer is performed in a third processing chamber.

10. The method of claim 9 wherein the first and second processing chambers are provided by a first apparatus, and the third processing chamber is provided by a second apparatus remote for the first apparatus.

11. The method of claim 10 wherein the first apparatus is dedicated solely for photoresist removal.

12. A method for manufacturing an integrated circuit device, the method comprising:

positioning a wafer on a substrate support member of a first processing chamber, the first processing chamber is hardware configured to automatically maintain the substrate support member at a temperature of at least about 250 degrees Celsius, and the substrate support member includes at least three retractable pins capable of elevating the wafer from a surface of the substrate support member;

automatically maintaining the substrate support member at the temperature;

elevating away the wafer from the surface of the substrate support member using the at least three retractable pins, thereby reducing thermal heating of the substrate from the substrate support member;

etching a photoresist layer of the wafer while the wafer is in an elevated position such that the wafer is away from the surface of the substrate support member during the etching of the photoresist layer; and etching an anti-reflective layer of the wafer to remove at least about 98% of the anti-reflective layer;

wherein a temperature of the wafer during the elevating, etching the photoresist layer, and etching the anti-reflective layer remains less than about 200 degrees Celsius to avoid densification of the anti-reflective layer.

13. The method of claim 12 wherein the temperature of the wafer remains less than 150 degrees Celsius.

14. The method of claim 12 wherein the at least three pins includes four pins.

15. The method of claim 12 wherein the at least three pins elevate the wafer at least 0.8 centimeters from the surface of the substrate support member.

16. The method of claim 12 wherein the at least three pins are disposed in a triangular shape.

* * * * *

UNITED STATES PATENT AND TRADEMARK OFFICE
CERTIFICATE OF CORRECTION

| | | |
|---|---|---|
| PATENT NO. | : 7,598,179 B2 | Page 1 of 1 |
| APPLICATION NO. | : 11/243883 | |
| DATED | : October 6, 2009 | |
| INVENTOR(S) | : Wang et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 622 days.

Signed and Sealed this

Twenty-eighth Day of September, 2010

David J. Kappos
*Director of the United States Patent and Trademark Office*